(12) United States Patent
Tien et al.

(10) Patent No.: US 7,424,806 B2
(45) Date of Patent: Sep. 16, 2008

(54) METHOD FOR AUTO-REGULATING FAN SPEED

(75) Inventors: Chi-Wei Tien, Taipei (TW); Jenq-Haur Pan, Taipei (TW)

(73) Assignee: Compal Electronics, Inc., Taipei (TW)

( * ) Notice: Subject to any disclaimer, the term of this patent is extended or adjusted under 35 U.S.C. 154(b) by 608 days.

(21) Appl. No.: 10/905,187

(22) Filed: Dec. 21, 2004

(65) Prior Publication Data

US 2006/0037334 A1    Feb. 23, 2006

(30) Foreign Application Priority Data

Aug. 17, 2004   (TW) .............................. 93124620 A

(51) Int. Cl.
*F25B 21/02*    (2006.01)
*F24F 7/00*     (2006.01)
*F25D 17/00*    (2006.01)
*G05D 23/00*    (2006.01)

(52) U.S. Cl. .......................... 62/178; 236/49.3; 700/299

(58) Field of Classification Search ................... 62/178, 62/186, 259.2; 361/695, 688, 687; 700/299, 700/300; 236/49.3, DIG. 9
See application file for complete search history.

(56) References Cited

U.S. PATENT DOCUMENTS

| 2002/0079746 A1* | 6/2002 | Hashimoto ................. 307/149 |
| 2002/0120367 A1* | 8/2002 | Emberty et al. ............. 700/282 |
| 2004/0264125 A1* | 12/2004 | Cheng et al. ................ 361/687 |

FOREIGN PATENT DOCUMENTS

| CN | 1474062 A   | 2/2004 |
| JP | 2004-199538 | 7/2004 |
| TW | 564341      | 2/2002 |

* cited by examiner

*Primary Examiner*—Chen-Wen Jiang
(74) *Attorney, Agent, or Firm*—Jianq Chyun IP Office

(57) ABSTRACT

The present invention relates to a method for auto-regulating the fan speed. The method includes detecting the temperature of a thermal source. When the temperature of the thermal source exceeds a target value, the fan speed of the fan is regulated according to a relation between the temperature of the thermal source and the fan speed of the fan. Thereafter, the voltage applied to the fan is micro-adjusted through a feedback control mechanism so that the fan speed of the fan reaches a specified speed in steps.

12 Claims, 4 Drawing Sheets

METHOD FOR AUTO-REGULATING FAN SPEED

CROSS-REFERENCE TO RELATED APPLICATION

This application claims the priority benefit of Taiwan application serial no. 93124620, filed Aug. 17, 2004.

BACKGROUND OF THE INVENTION

1. Field of the Invention

The present invention relates to a method of regulating a cooling fan. More particularly, the present invention relates to a method for regulating the fan speed automatically so that the cooling performance is increased and a balance between the cooling efficiency and the noise of the cooling fan is achieved.

2. Description of the Related Art

A conventional cooling system is normally categorized into an air-cooling type and a water-cooling type. Using a notebook computer as an example, all of the central processor, the north bridge chip and the graphic chip on a main board are integrated circuit (IC) chips. In general, integrated circuit (IC) chips are the major sources of heat during operations in computer. To rapidly carry the heat generated by the IC chips away during a high-speed operation, and allow the IC chips to be operated for a long period, conventionally, a heat sink is directly attached to the backside of the IC chips. The heat sinks are normally fabricated using metallic or ceramic material with a high thermal conductivity.

In most notebook or other computer systems, it is insufficient to conduct the heat generated from the IC chips by only using the heat sink. Then it is necessary to include an additional cooling fan in the system to produce a cooling air flow, which flows toward an air outlet for dissipating heat to outside. It should be noted that an air-cooled module utilizes both a stream of cooling air from a fan and the large heat-dissipating area of the heat sink to increase the cooling performance. To provide a sufficiently strong air stream through a cooling fan, the wind-cut noise due to rotation of fan is accordingly produced. Furthermore, the air steam may produce a phenomenon of local high temperature close to the air outlet after absorbing a large quantity of heat from the operating ICs. When the air inlet or the air outlet is blocked causing a poor air circulation, the operating temperature inside the system easily becomes over high, causing an occurrence of damage. Once the temperature of internal IC chips or other internal devices exceed the specified operating range, computational error or temporary failure of the system may occur in the main board.

As a result, one major research topic in the minds of the manufacturers is to provide a means of regulating the fan speed of the cooling fan so that the efficiency of the cooling fan is increased and yet prevent the temperature of the thermal sources (for example, IC chips) from being over high, causing damage. With respect to the control of fan speed of fan, conventionally, the fan speed of the fan is simply regulated according to a relationship curve between the temperature of the thermal source and the voltage supplied to the cooling fan. However, if the system does not have a mechanism for detecting the difference between the actual fan speed of the fan and a prescribed fan speed but provides a voltage to the fan purely according to the relationship between the supplied voltage of the fan and the temperature of the thermal source, the cooling fan may rotate faster than the specification and waste electricity. On the other hand, if the system has a mechanism for detecting and regulating the actual fan speed of the fan and the prescribed fan speed, then the actual fan speed of the cooling fan is adjusted in a single operation to the prescribed fan speed when the fan reaches the fan speed regulating point. As an often result, the thermal source may continuously rise to a temperature close to the threshold temperature and shortens the lifetime of the thermal source. Moreover, the noise due to the sudden increase in the fan speed of the cooling fan may also bother the user.

FIG. 1 is a flow chart showing the steps in a Taiwanese patent No. 564341 having the title 'a fan speed control device and a method for controlling the fan speed of a fan'. As shown in FIG. 1, the method comprises the following steps. In step 302, a temperature sensor detects a temperature and outputs a corresponding temperature signal. In step 304, a processing unit receives the temperature signal and exports a corresponding prescribed fan speed for the fan. In step 306, a control unit receives the prescribed fan speed value and transmits a corresponding regulating signal to the fan. In step 308, the control unit checks the difference between the actual fan speed of the fan and the prescribed fan speed. In step 310, the control unit accurately controls the fan speed of the fan according to the difference between the actual fan speed and the prescribed fan speed of the fan. However, the drawback of this method is that the actual fan speed of the fan is adjusted to the prescribed fan speed in a single operation. Hence, the temperature of the thermal source will continue to rise for a short period of time before it is balanced with the heat-dissipating rate. Moreover, the one-step adjustment from the actual fan speed of the fan to the prescribed fan speed can easily lead to a sudden burst of acoustic noise that may bother the user of the computer system.

SUMMARY OF THE INVENTION

Accordingly, at least one objective of the present invention is to provide a method that utilizes a feedback control mechanism to regulate the fan speed of a cooling fan. Hence, the cooling rate of the fan is increased and any possible damage due to an excessive rise in the temperature of thermal sources is prevented.

At least another objective of the present invention is to provide a method for auto-regulating the fan speed of a cooling fan that utilizes a step by step adjustment of the voltage for driving the fan. Therefore, it can be prevented that a balance with the heat-dissipating rate is reached after the temperature of the thermal sources rises for a certain period of time.

At least another objective of the present invention is to provide a method for auto-regulating the fan speed of a cooling fan that utilizes the adjustment of supplied voltage to regulate the fan speed and reduce the power consumption of the fan.

At least another objective of the present invention is to provide a method for auto-regulating the fan speed of a cooling fan that prevents the sudden outburst of acoustic noise due to a sudden change in the fan speed of the fan from bothering a computer system user.

To achieve these and other advantages and in accordance with the purpose of the invention, as embodied and broadly described herein, the invention provides a method for auto-regulating the fan speed of a cooling fan comprising the following steps. The temperature of a thermal source is detected. When the temperature of the thermal source exceeds a target value, the voltage to be provided to the fan is regulated according to the relation between the temperature of the thermal source and the voltage provided on the cooling fan. Then, a feedback control manner is used to regulate the voltage provided to the cooling fan, so as to cause the fan speed of the cooling fan to gradually reach the specific requirement.

To achieve these and other advantages and in accordance with the purpose of the invention, as embodied and broadly described herein, the invention provides a method for auto-regulating the fan speed of a cooling fan comprising the following steps. First, the temperature of a thermal source is detected. When the temperature of the thermal source exceeds a target value, a cooling fan is triggered to initiate a cooling process. If the fan speed of the fan is higher than the fan speed specified by the target value, an embedded controller (EC) lowers the voltage to the fan in steps so that the fan speed is adjusted down towards the fan speed specified by the standard value. However, if the fan speed of the fan is lower than the fan speed specified by the target value, the embedded controller (EC) increases the voltage for driving the fan in steps so that the fan speed is adjusted up towards the fan speed specified by the standard value.

According to one embodiment of the present invention, the aforementioned method further comprises checking the thermal source. When the temperature of the thermal source is lower than a target value, the voltage for driving the cooling fan is adjusted according to the relation between the temperature of the thermal source and the corresponding voltage applied to the fan. On the other hand, when the temperature of the thermal source is below a target value, the cooling fan is shut down.

The present invention utilizes an embedded controller to lower the driving voltage of the fan in steps so that the fan speed of the fan is lowered to the specified value gradually after the fan speed of the fan reaches a specified fan speed. Thus, the temperature of the thermal source is prevented from continuously rising to a threshold temperature and can remain a stable balance state. Thereafter, a feedback control method is utilized to adjust the fan speed of the fan in steps until the temperature of the thermal source is lowered to the target value, to prevent any damage to the thermal source due to over heat. When the fan speed of the fan is adjusted to a level below a specified fan speed, the embedded controller gradually increases the voltage for driving the fan so that the fan speed of the fan increases gradually to reach the specified fan speed. Hence, the fan speed of the fan is increased smoothly and annoying noise to the computer user due to a sudden rising up of the fan is eliminated.

It is understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
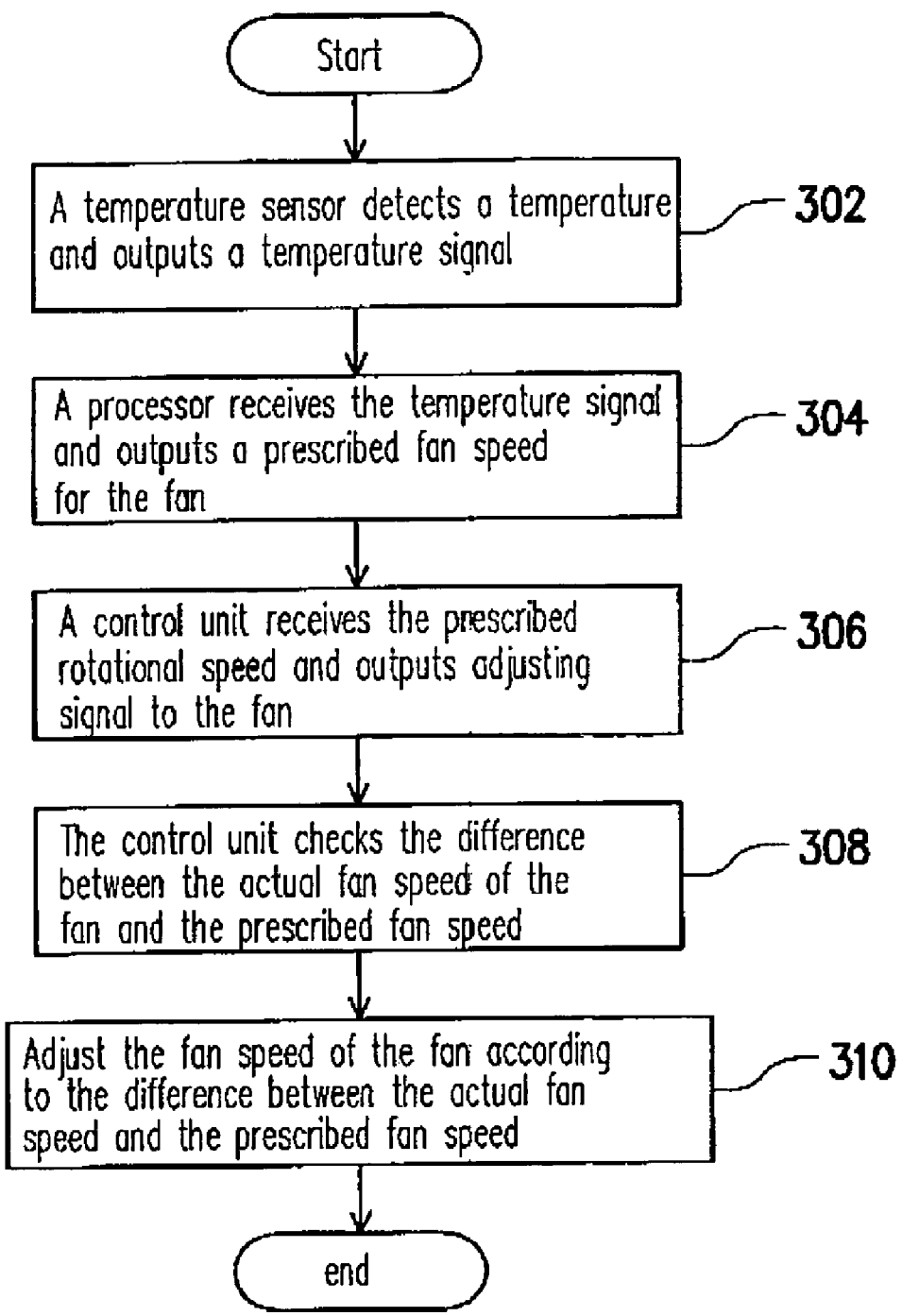
FIG. 1 is a flow chart showing the steps in a Taiwan patent No. 564341 having the title 'a fan speed control device and a method for controlling the fan speed of a fan'.

Reference will now be made in detail to the present preferred embodiments of the invention, examples of which are illustrated in the accompanying drawings. Wherever possible, the same reference numbers are used in the drawings and the description to refer to the same or like parts.

Figure 2:
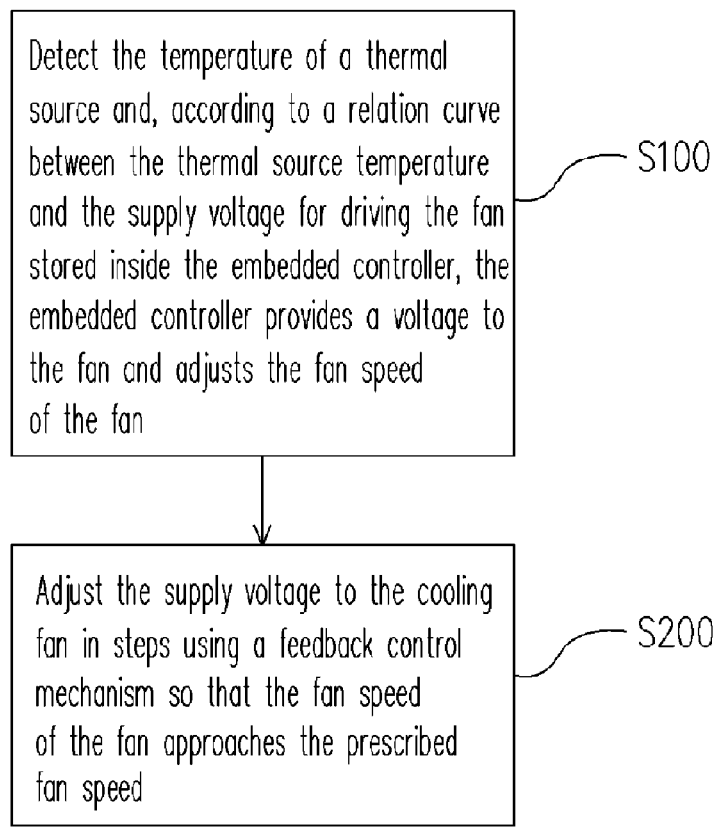
FIG. 2 is a flow chart showing the steps for auto-regulating the fan speed of a cooling fan according to one preferred embodiment of the present invention.

FIG. 2 is a flow chart showing the steps for auto-regulating the fan speed of a cooling fan according to one preferred embodiment of the present invention. As shown in FIG. 2, the method for auto-regulating the fan speed of the cooling fan comprises the following steps. In step S100, the temperature of a thermal source is detected. Thereafter, according to a curve relating the temperature of the thermal source with the voltage for driving the fan stored inside an embedded controller, the embedded controller provides a corresponding voltage to the fan to adjust the fan speed. In step S200, a feedback control mechanism is utilized to adjust the supply voltage to the fan in steps so that the fan speed of the fan is gradually regulated back to a specified fan speed.

In step S100, the thermal source is an IC chip, a system level chip or a central processing chip disposed on a main board, for example. The backside of the chip is attached to or adjacent to a heat sink fabricated from metallic and/or ceramic material to increase heat-dissipating surface. Clearly, the thermal source can also be a high/low voltage transformer or a high-power transistor whose heat must be continuously carried away to maintain a normal operation. Furthermore, to increase the heat-dissipating capacity of the system, a cooling fan is installed inside the system to provide a convective air circulation over the thermal source and carry the heat in the thermal source away.

It should be noted that there is a definite relationship between the fan speed of the fan and its driving voltage. In other words, the fan speed of the fan can be varied through a change in the supplied voltage. For example, a standard supply voltage of 3.5V is required to maintain a constant rotation of 5000 RPM for the fan. However, the fan speed of the cooling fan normally has an error range about ±7%. Therefore, the fan speed of two cooling fans may be slightly different when the same voltage is applied to each cooling fan. If the cooling fan inside a system has a −7% error, the fan may not provide sufficient fan speed to cool a thermal source to an acceptable level when the driving voltage of the fan is determined according to the relationship between thermal source temperature and fan driving voltage. Ultimately, the temperature of the thermal source then over rises because the required fan speed often cannot be achieved.

Therefore, the present invention also provides a feedback control mechanism to monitor the temperature of the thermal source as shown in step S100 of FIG. 2. When the temperature of the thermal source detected is higher than a target value, a voltage corresponding is quickly applied to the fan according to the relation between the temperature of the thermal source and the voltage provided to the fan, so as to increase the fan speed of the fan. The target value is the fan speed of the cooling fan listed in a table, corresponding to a temperature of the thermal source. Because the fan speed of the fan, after providing the fan with the voltage, usually may not correspond to the target value, a feedback control system having an embedded controller as shown in step 200 is used to adjust the supply voltage to the fan in steps. For example, when the prescribed temperature of the thermal source is 75° C., the cooling fan is triggered and the fan speed of the fan is determined according to the temperature of the thermal source. Thereafter, the fan speed of the cooling fan is continuously monitored. When the fan speed of the fan exceeds the specified fan speed, the embedded controller decreases the driving voltage of the fan in steps so that the fan speed of the fan decreases gradually and the electronic device consumes less power. On the other hand, when the fan speed of the cooling fan is too low, the embedded controller increases the supply voltage of the fan in steps. Hence, the thermal source is prevented from over-heating by gradually increasing the fan speed of the fan, and it can be prevented from occurring for the over noise suddenly produced by the increase of rotation speed for the fan.

Figure 3:
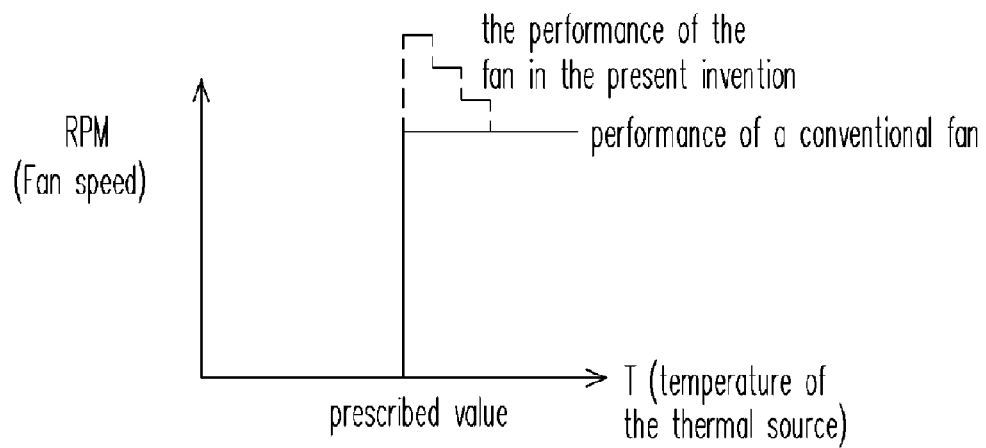
FIG. 3 is a graph showing the fan speed versus temperature curves for a conventional cooling fan and a cooling fan according to the present invention.

FIG. 3 is a graph showing the fan speed versus temperature curves for a conventional cooling fan and a cooling fan according to the present invention. When the temperature of the thermal source reaches a target value and the fan speed of the fan therefore must be increased, the fan speed of the cooling fan then increases according to an increase in the applied voltage, so as to increase the heat-dissipating rate. Wherein, the voltage applied to the cooling fan is determined by the relation curve between the fan supply voltage and the thermal source temperature. If the conventional method is used to control the cooling fan, the cooling fan receives the supply voltage and the fan speed of the fan is immediately increased. After then, the supply voltage to the cooling fan is maintained at a fixed value and the fan speed of the fan is maintained at a fixed value until the temperature of the thermal source reaches the next target value necessarily for changing the supply voltage of the fan. Thus, the conventional method for controlling the cooling fan often sets the fan to continuously maintain an over-high fan speed or an over-low fan speed so that the electronic device either consumes too much power or provides an insufficient cooling rate. In the method according to the present invention, the cooling fan utilizes the relationship curve between the supply voltage of the cooling fan and the temperature of the thermal source to receive a supply voltage for increasing. After increasing the fan speed of the fan to a fixed value, the system starts to compare the difference between the actual rotation speed of the fan and a specified fan speed. If the fan speed of the cooling fan is higher than the specified fan speed, an embedded controller lowers the supply voltage to the fan in steps so that the fan speed of the fan is gradually reduced (as shown in FIG. 3). Hence, some electrical power is saved and the risk of the thermal source rising to a temperature beyond the threshold temperature is effectively avoided. On the other hand, if the fan speed of the cooling fan drops below the specified fan speed, the embedded controller increases the supply voltage to the fan in steps so that the fan speed of the fan increases gradually (as shown in FIG. 3). As a result, the heat-dissipating efficiency of the cooling system is increased and the bothering of noise to the user produced by the fan is reduced.

Figure 4:
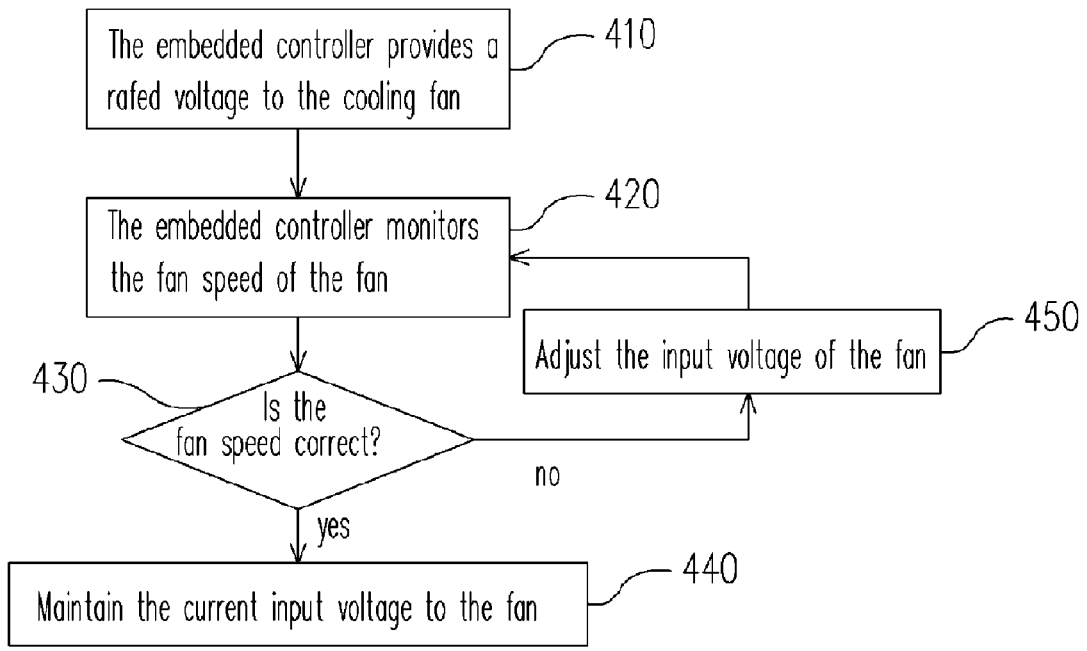
FIG. 4 is a flow chart showing the steps for regulating the fan speed of a cooling fan using an embedded controller according to the present invention.
Figure 5:
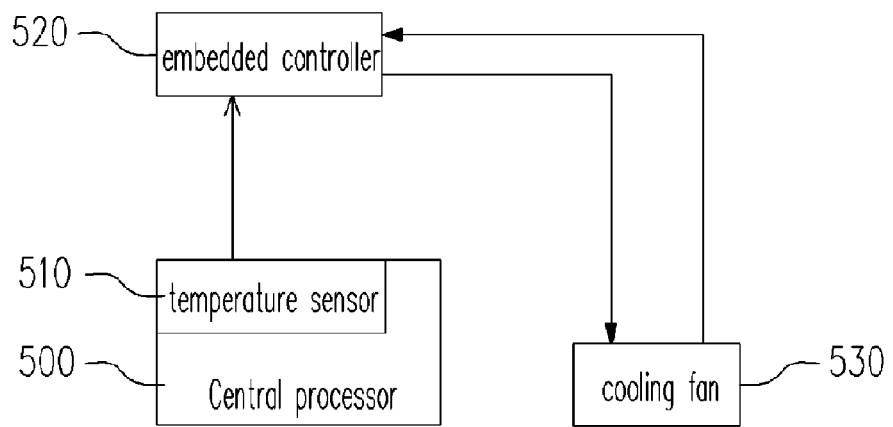
FIG. 5 is a simplified block diagram showing the layout of components for regulating the fan speed of a cooling fan through an embedded controller.

The method for regulating the fan speed of the cooling fan through the embedded controller is further explained using FIGS. 4 and 5. FIG. 4 is a flow chart showing the steps for regulating the fan speed of a cooling fan using an embedded controller according to the present invention. FIG. 5 is a simplified block diagram showing the layout of components for regulating the rotation speed of a cooling fan through an embedded controller. As shown in FIG. 5, the variation in temperature of the central processor 500 can be obtained through a temperature sensor 510. The temperature sensor 510 transmits a signal to an embedded controller 520 for controlling the needed fan speed of the fan 530. The controlling method is shown in FIG. 4. In step 410, the embedded controller 520 provides a rated voltage to drive the cooling fan 530. In step 420, the embedded controller 520 checks the fan speed of the fan 530. In step 430, the fan speed is compared with a specified fan speed to determine whether the actual fan speed is correct or not. If the actual fan speed is correct, the current input voltage is maintained in step 440. However, if the actual rotation speed differs from the specified rotation speed, the input voltage to the fan 530 is gradually increased in step 450.

Figure 6:
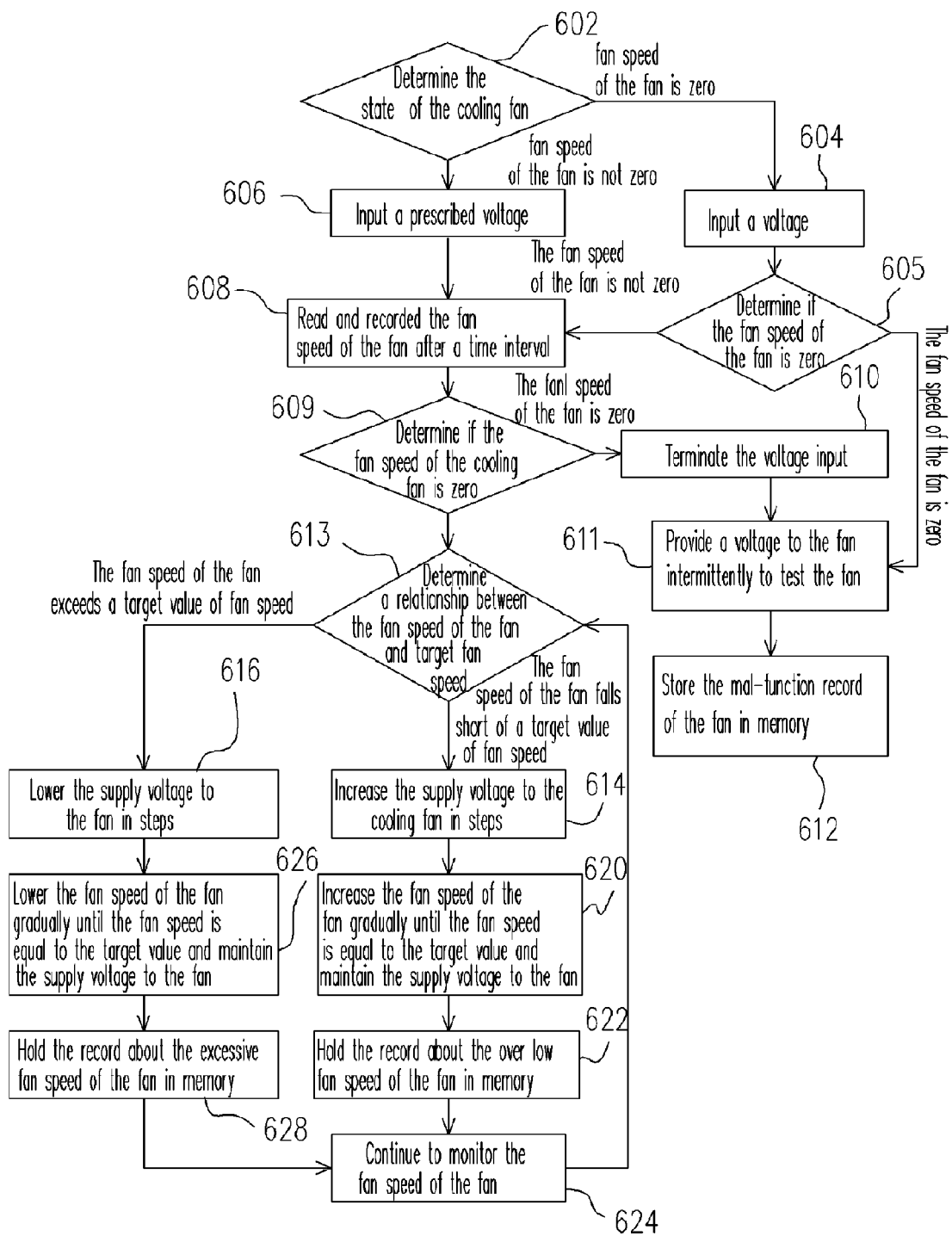
FIG. 6 is a flow chart showing a feedback control mechanism for regulating the fan speed of a cooling fan according to the present invention.

FIG. 6 is a flow chart showing a feedback control mechanism for regulating the fan speed of a cooling fan according to the present invention. In the following, each step carried out in FIG. 6 is explained in more detail. First, in step 602, the current state of the cooling fan is determined. If the fan speed of the fan is zero, the embedded controller applies a voltage for a definite period in step 604. Thereafter, in step 605, the fan speed is checked to determine if the fan speed of the fan is still zero, so as to decide whether or not the fan is damaged. In general, the interval for activating the fan is set to about 3 seconds but not the only limitation in the invention. After several attempts to start the cooling fan by providing a voltage and the fan speed of the fan is still zero, the cooling fan is judged to be defective and the data indicating the mal-function of this cooling fan is stored in a memory, in step 612. If the fan speed of the fan is found to be non-zero in step 602 and 605, the embedded controller stop providing a voltage to the fan for a while before supplying a predetermined voltage to the fan in step 606. The predetermined voltage is a voltage derived from the relationship curve between the thermal source temperature and the fan supply voltage. After each designated time period, the fan speed of the fan is read and recorded in step 608. Moreover, in step 609, the fan is constantly checked to see if the fan speed is zero. If the fan speed of the fan is found to be zero, the embedded controller immediately terminates the supply of a voltage to the fan in step 610 and provides a voltage to the fan intermittently several times for testing the fan in step 611. If the fan speed of the fan is still zero, the cooling fan is judged to be defective and all relevant data regarding this cooling fan is stored inside a memory in step 612. In the future, maintenance personal can retrieve the data inside the memory to determine if any damage of the electronic device is related to the mal-function of the cooling fan or not. In step 613, the fan speed of the fan is compared with a target value.

If the fan speed of the cooling fan is lower than the target value, the embedded controller increases the supply voltage to the cooling fan in steps in step 614 so that the fan speed of the fan increases gradually towards the target value. Thereafter, in step 620, the embedded controller continuously provides a supply voltage to the cooling fan. The value of the supply voltage is the voltage for maintaining the fan speed of the fan at the target value so that the heat flow efficiency is increased while the probability of producing a sudden acoustic noise is reduced. In general, when the fan speed of the cooling fan is above or below the target value by 100 RPM, the fan speed of the fan is considered to be within the range of the target value. Because the fan speed of the fan is lower than the target value when a constant voltage is applied, the cooling fan is judged to have a too-low fan speed. Thereafter, in step 622, the low fan speed of the cooling fan is recorded and stored in the memory so that any problem in the electronic device resulting from a low fan speed of the fan can be easily determined. Finally, the fan speed of the fan is continuously detected in step 624.

If the fan speed of the cooling fan is higher than the target value, the embedded controller gradually decreases the supply voltage to the cooling fan in step 616, so that the fan speed of the fan decreases gradually towards the target value. Thereafter, in step 626, the embedded controller continuously provides a supply voltage to the cooling fan. The value of the supply voltage is the voltage for maintaining the fan speed of the fan at the target value. At this stage, the required cooling fan voltage is smaller than the supply voltage derived from the relation between the thermal source temperature and fan supply voltage. Thus, the electronic device consumes less electrical power and the cooling fan is prevented from producing a sudden burst of acoustic noise. In general, when the fan speed of the cooling fan is above or below the target value by 100 RPM, the fan speed of the fan is considered to be within the range of the target value. Because the fan speed of the fan is higher than the target value when a constant voltage is applied, the cooling fan is judged to have a too-high fan speed. Thereafter, in step 628, the high fan speed of the cooling fan is recorded and stored in the memory so that any problem in the electronic device resulting from a high fan speed of the fan can be easily determined. Finally, the fan speed of the fan is continuously detected in step 624.

In summary, the present invention provides a method for auto-regulating the fan speed of a cooling fan that comprises the following steps. The temperature of a thermal source is monitored. When the temperature of the thermal source exceeds a target value, the fan is triggered to initiate a cooling process. If the fan speed of the fan is higher than the fan speed at the target value, an embedded controller (EC) lowers the voltage for driving the fan in steps so that the fan speed is downward adjusted towards the target fan speed. Hence, power consumption of the fan is reduced and the temperature of the thermal source is prevented from rising to the threshold temperature and destabilizing the thermal source. On the other hand, if the fan speed of the fan is lower than the fan speed at the target value, the embedded controller (EC) increases the voltage for driving the fan in steps, so that the fan speed is gradually upward adjusted towards the target fan speed. Therefore, the heat-dissipating efficiency of the fan is improved and the noise resulting from a sudden increase in the fan speed is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for auto-regulating a fan speed, comprising:
   determining whether said fan speed of a cooling fan is zero or not;
   When said fan speed is zero, an embedded controller provides an action voltage to active said cooling fan;
   intermittently providing a voltage to said cooling fan by said embedded controller if said fan speed is continuous zero after applying said action voltage;
   judging said cooling fan is defective if said fan speed is continuous zero after intermittently providing said voltage to said cooling fan;
   storing a defective cooling fan data in a memory;
   when said fan speed is not zero, said embedded controller provides a prescribed voltage to drive the cooling fan;
   detecting the fan speed of the cooling fan;
   judging a relation between the fan speed and a target value; and
   gradually decreasing the supply voltage through the embedded controller until the fan speed of the cooling fan substantially equals to the target value.

2. The method of claim 1, wherein the fan speed is higher than the target value.

3. The method of claim 1, wherein the target value is the fan speed of the fan listed in a table, corresponding to a temperature of the thermal source.

4. The method of claim 1, wherein the prescribed voltage is derived from a relation curve between the temperature of the thermal source and the supply voltage.

5. The method of claim 1, wherein the method further comprises judging the cooling fan to be one having over high fan speed.

6. The method of claim 1, after gradually decreasing the supply voltage through the embedded controller, further comprising storing the data indicating an excessive fan speed of the cooling fan to a memory.

7. A method for auto-regulating a fan speed, comprising:
   determining whether a speed of a cooling fan is zero or not;
   when said fan speed is zero, an embedded controller provides an action voltage to active said cooling fan;
   intermittently providing a voltage to said cooling fan by said embedded controller if said fan speed is continuous zero after applying said action voltage;
   judging said cooling fan is defective if said fan speed is continuous zero after intermittently providing said voltage to said cooling fan;
   storing a defective cooling fan data in a memory;
   When said fan speed is not zero, said embedded controller provides a prescribed voltage to drive the fan by an embedded controller;
   detecting the fan speed of the cooling fan;
   judging a relation between the fan speed and a target value; and
   gradually increasing the supply voltage through the embedded controller until the fan speed of the cooling fan is substantially equals to the target value.

8. The method of claim 7, wherein the fan speed is lower than the target value.

9. The method of claim 7, wherein the target value is the fan speed of the fan listed in a table, corresponding to a temperature of the thermal source.

10. The method of claim 7, wherein the prescribed voltage is derived from a relation curve between the temperature of the thermal source and the supply voltage.

11. The method of claim 7, wherein the method further comprises judging the cooling fan to be one having over low fan speed.

12. The method of claim 7, after gradually increasing the supply voltage through the embedded controller, further comprising storing the data indicating an over low fan speed of the cooling fan to a memory.

* * * * *